United States Patent
Kitagawa et al.

(10) Patent No.: US 10,418,081 B1
(45) Date of Patent: Sep. 17, 2019

(54) APPARATUSES AND METHODS FOR PROVIDING VOLTAGES TO CONDUCTIVE LINES BETWEEN WHICH CLOCK SIGNAL LINES ARE DISPOSED

(71) Applicant: MICRON TECHNOLOGY, INC., Boise, ID (US)

(72) Inventors: Katsuhiro Kitagawa, Hino (JP); Akira Yamashita, Sagamihara (JP); Shuichi Murai, Tsukuba (JP); Kohei Nakamura, Fuchu (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/156,862

(22) Filed: Oct. 10, 2018

(51) Int. Cl.
G11C 7/22 (2006.01)
G11C 11/4076 (2006.01)
H03K 5/15 (2006.01)
H03K 5/00 (2006.01)

(52) U.S. Cl.
CPC .......... *G11C 7/222* (2013.01); *G11C 11/4076* (2013.01); *H03K 5/1506* (2013.01); *H03K 2005/00286* (2013.01)

(58) Field of Classification Search
CPC .. G11C 7/222; G11C 11/4076; H03K 5/1506; H03K 2005/00286
See application file for complete search history.

(56) References Cited

U.S. PATENT DOCUMENTS

| | | | |
|---|---|---|---|
| 2002/0116423 A1 | 8/2002 | Bredin et al. | |
| 2006/0044891 A1* | 3/2006 | Lin | G11C 7/1006 365/193 |
| 2006/0092929 A1* | 5/2006 | Chun | G06F 1/10 370/362 |
| 2009/0114994 A1* | 5/2009 | Kim | H01L 21/823892 257/369 |
| 2010/0301906 A1* | 12/2010 | De Laurentiis | H03K 23/00 327/115 |

OTHER PUBLICATIONS

U.S. Appl. No. 15/937,552 titled 'Apparatuses and Methods for Providing Clock Signals in a Semiconductor Device' filed Mar. 27, 2018.
U.S. Appl. No. 16/444,365, titled "Apparatuses and Methods for Providing Clock Signals in a Semiconductor Device" filed Jun. 18, 2019.

* cited by examiner

Primary Examiner — Daniel C Puentes
(74) Attorney, Agent, or Firm — Dorsey & Whitney LLP

(57) ABSTRACT

Apparatuses and methods for providing voltages to conductive lines between which clock signal lines are disposed are disclosed. Voltages provided to the conductive lines may provide voltage conditions for clock signals on the clock signal lines that are relatively the same for at least some of the clock edges of the clock signals. Having the same voltage conditions may mitigate variations in timing/phase between the clock signals due to different voltage influences when a clock signal transitions from a low clock level to a high clock level.

8 Claims, 6 Drawing Sheets

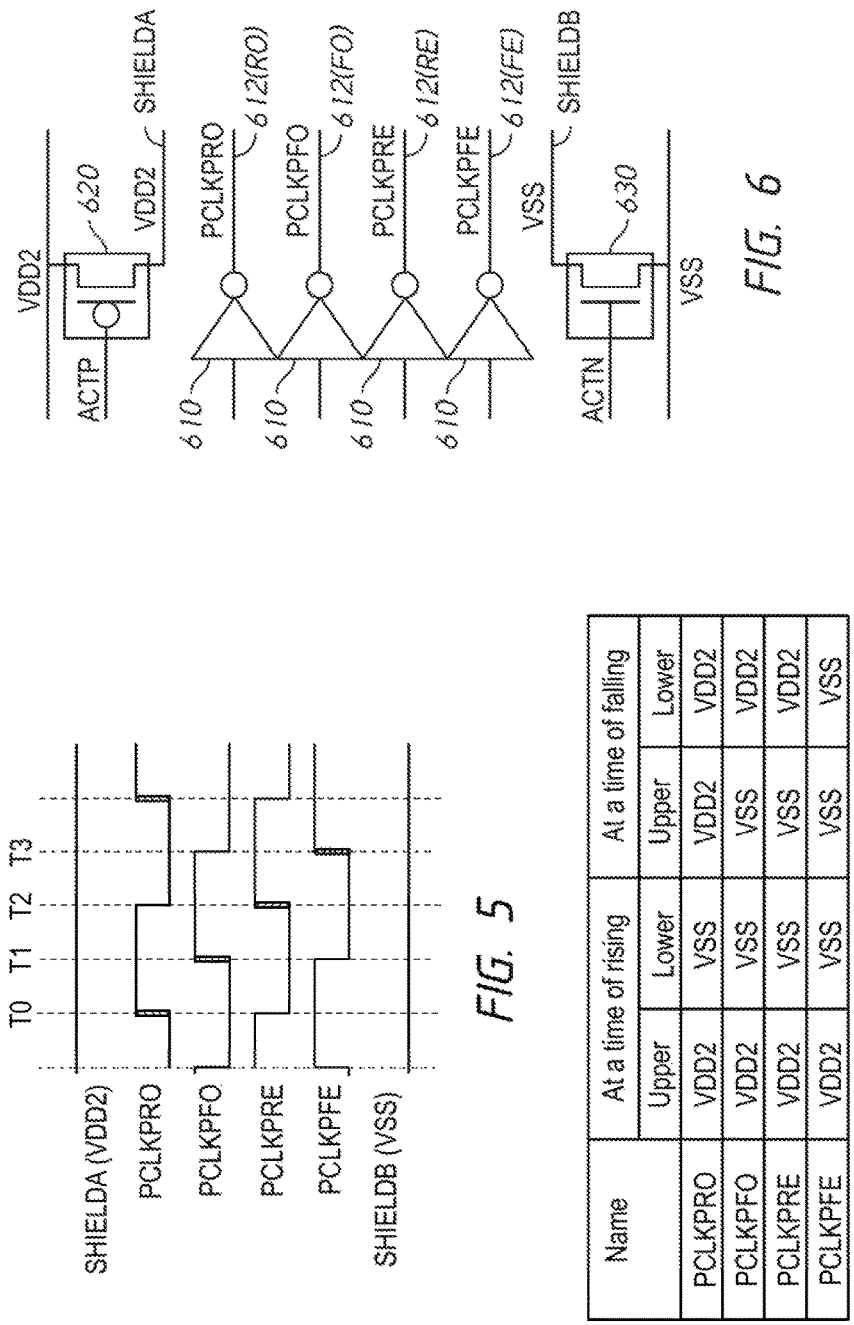

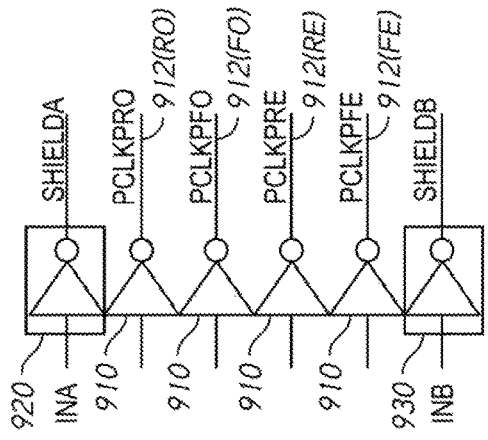
FIG. 9
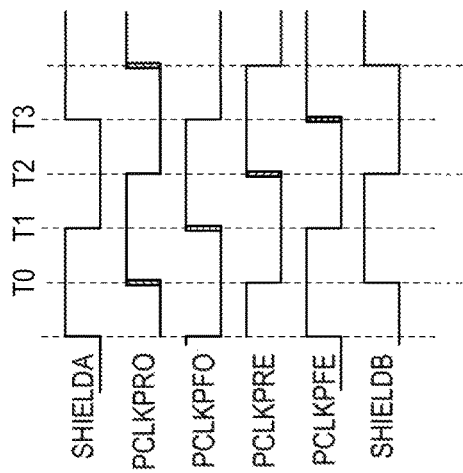
FIG. 8
| Name | At a time of rising | | At a time of falling | |
|---|---|---|---|---|
| | Upper | Lower | Upper | Lower |
| PCLKPRO | VDD2 | VSS | VSS | VDD2 |
| PCLKPFO | VDD2 | VSS | VSS | VDD2 |
| PCLKPRE | VDD2 | VSS | VSS | VDD2 |
| PCLKPFE | VDD2 | VSS | VSS | VDD2 |
FIG. 10
| Phases | Lines | Dummy Lines | Total | Rate |
|---|---|---|---|---|
| 4 | 4 | 2 | 6 | 50% |
| 8 | 8 | 2 | 10 | 25% |
| 16 | 16 | 2 | 18 | 12.5% |
| 32 | 32 | 2 | 34 | 6.25% |
FIG. 11

APPARATUSES AND METHODS FOR PROVIDING VOLTAGES TO CONDUCTIVE LINES BETWEEN WHICH CLOCK SIGNAL LINES ARE DISPOSED

BACKGROUND

Semiconductor memories are used in many electronic systems to store data that may be retrieved at a later time. As the demand has increased for electronic systems to be faster, have greater data capacity, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller, for example. The command signals may control the semiconductor memories to perform various memory operations, for example, a read operation to retrieve data from a memory, and a write operation to store data to the memory. The data may be provided between the controller and memories with known timing relative to receipt by the memory of an associated command. The known timing is typically defined by latency information. The latency information may be defined by numbers of clock cycles of system clock signals CK and CKF.

With newly developed memories, the memories may be provided with system clock signals that are used for timing the command signals and address signals, for example, and further provided with data clock signals that are used for timing the read data provided by the memory and for timing the write data provided to the memory. The memories may also provide clock signals to the controller for timing the provision of data provided to the controller. The clock signals provided to the memories may also change clock frequencies, for example, have a relatively high clock frequency when higher speed operation is desirable, and have a relatively low clock frequency when lower speed operation is acceptable.

The clock signals provided to the memories are used to provide internal clocks that control the timing of various circuits during operation. The timing of the circuits during operation may be critical, and deviations in the timing of the clock signals may cause erroneous operation. This may especially be the case for higher frequency clock signals where even relatively small timing deviations can create problems.

Timing deviations may be caused by various conditions, for example, different voltage conditions for the internal clock signals when provided from one internal circuit to another. The different voltage conditions may cause the timing of one or more of the internal clock signals to deviate relative to other internal clock signals. Where such timing deviations of the internal clock signals occur, circuits controlled by the internal clock signals may not operate properly and cause erroneous operation. As a result, approaches for providing internal clock signals with reduced timing deviation may be desirable.

BRIEF DESCRIPTION OF THE DRAWINGS

FIG. 5 is a diagram of clock signals provided to respective signal lines and voltages of conductive lines, between which the signal lines are disposed, according to an embodiment of the disclosure.

FIG. 6 is a schematic diagram of clock drivers and shield circuits according to an embodiment of the disclosure.

FIG. 7 is a diagram of a table that shows surrounding voltage conditions for each of the signal lines and the respective clock signals according to an embodiment of the disclosure.

FIG. 8 is a diagram of clock signals provided to respective signal lines and voltages of conductive lines, between which the signal lines are disposed, according to an embodiment of the disclosure.

FIG. 9 is a schematic diagram of clock drivers and shield circuits according to an embodiment of the disclosure.

FIG. 10 is a diagram of a table that shows surrounding voltage conditions for each of the signal lines and the respective clock signals according to an embodiment of the disclosure.

FIG. 11 is a diagram of a table that shows a relative relationship between a number of clock signals and respective signal lines and conductive lines that may be used for shielding the clock signals according to an embodiment of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically coupled. Indirectly coupled may imply that two components are coupled through one or more intermediate components.

Figure 1:
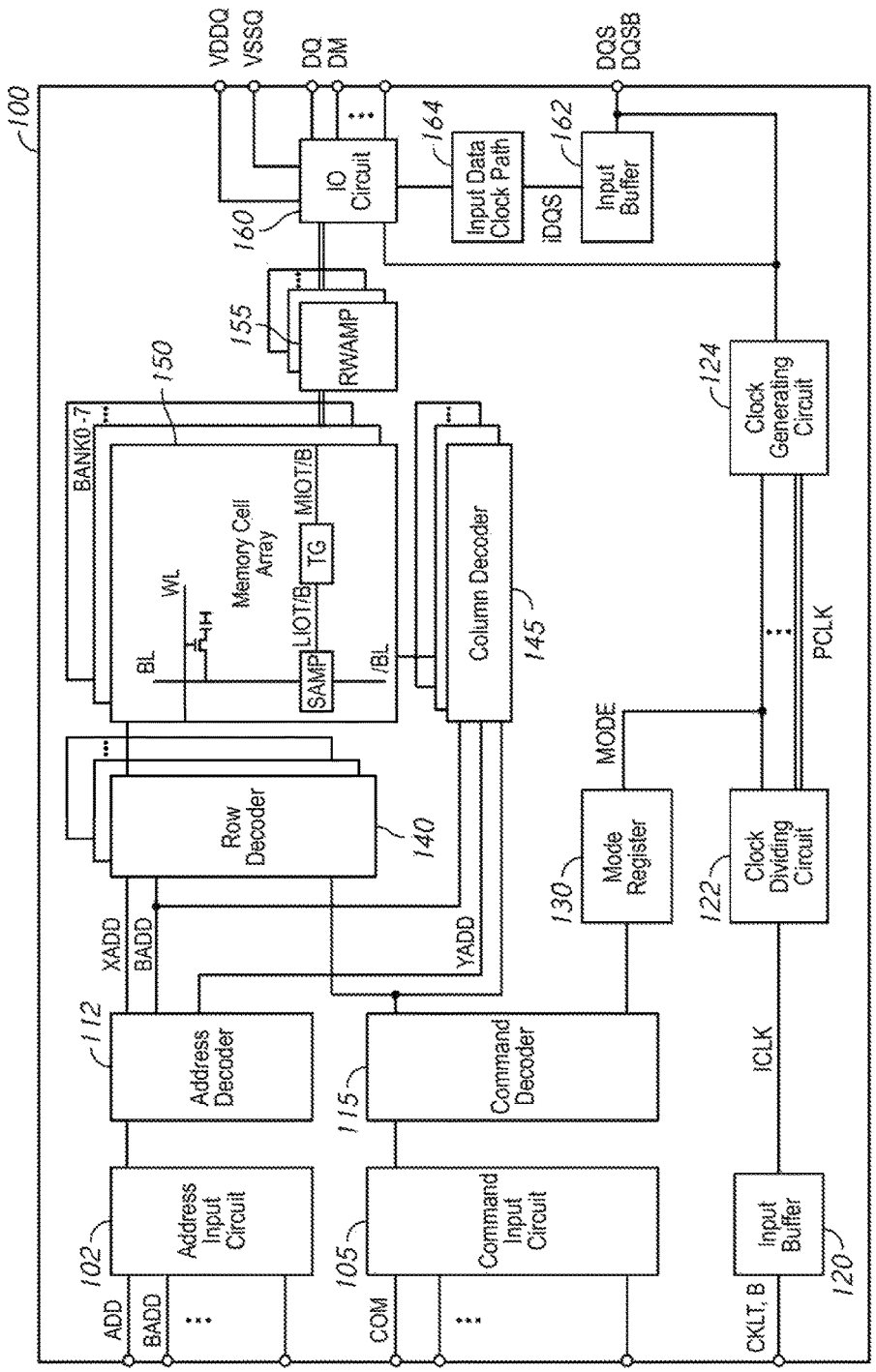
FIG. 1 is a block diagram of an apparatus according to an embodiment of the disclosure.

FIG. 1 is a block diagram of an apparatus according to an embodiment of the disclosure. The apparatus may be a semiconductor device 100, and will be referred as such. In some embodiments, the semiconductor device 100 may include, without limitation, a DRAM device, such as low power DDR (LPDDR) memory integrated into a single semiconductor chip, for example. The semiconductor device 100 includes a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 100 may employ a plurality of external terminals that include command terminals and address terminals coupled to a command bus and an address bus to receive commands COM and addresses ADD and BADD, clock terminals to receive clock signals CLKT and CLKB, strobe clock terminals to provide or receive strobe clock signals DQS and DQSB, data terminals DQ and DM, and power supply terminals VDDQ and VSSQ.

The address terminals may be supplied with an address ADD and a bank address BADD, for example, from a memory controller. The address ADD and the bank address BADD supplied to the address terminals are transferred, via an address input circuit 102, to an address decoder 112. The address decoder 112 receives the address and supplies a decoded row address XADD to the row decoder 140, and a decoded column address YADD to the column decoder 145. The address decoder 112 also receives the bank address and supplies a decoded bank address BADD to the row decoder 140 the column decoder 145.

The command terminals may be supplied with command COM from, for example, a memory controller. The command may be provided as internal command signals to a command decoder 115 via the command input circuit 105. The command decoder 11S includes circuits to decode the internal command signals to generate various internal signals and commands for performing operations. For example, the command decoder 115 may provide a row command signal to select a word line and a column command signal to select a bit line. The command decoder 115 also accesses a mode register 130 that stores information for setting various modes and features of operation for the semiconductor device 100. For example, the mode register 130 may store information for modes related to generating strobe clock signals DQS and DQSB from the CLKT and CLKB clock signals that are provided by the semiconductor device 100 (e.g., for read operations), and/or related to generating internal clock signals to time the operation of circuits when strobe signals DQS and DQSB are provided to the semiconductor device 100 (e.g., for write operations). The information stored by the mode register 130 may be programmed by providing the information to the semiconductor device 100.

When a read command is received and a row address and a column address are timely supplied with the read command, read data is read from a memory cell in the memory array 150 designated by the row address and column address. The read command is received by the command decoder 115, which provides internal commands to input/output circuit 160 so that read data is output to outside from the data terminals DQ via read/write amplifiers 155, and strobe clock signals DQS and DQSB are provided to outside from the strobe clock terminals.

When the write command is received and a row address and a column address are timely supplied with this command, then write data is supplied to the data terminals DQ according to the DQS and DQSB strobe clock signals. A data mask may be provided to the data terminals DM to mask portions of the data when written to memory. The write command is received by the command decoder 115, which provides internal commands to the input/output circuit 160 so that the write data is received by data receivers in the input/output circuit 160, and supplied via the input/output circuit 160 and the read/write amplifiers 155 to the memory array 150. The write data is written in the memory cell designated by the row address and the column address.

The clock terminals and data clock terminals are supplied with external clock signals. The external clock signals CLKT and CLKB are supplied to an input buffer 120, for example, from a memory controller. The CLKT and CLKB clock signals are complementary. The input buffer 120 generates an internal clock signal ICLK based on the CLKT and CLKB clock signals. The ICLK clock signal is provided to a clock dividing circuit 122. The input buffer 120 may generate other internal clock signals as well.

The clock dividing circuit 122 provides various phase and frequency controlled internal clock signals PCLK based on the ICLK clock signal. The PCLK clock signals may be multiphase clock signals that have phase relationship with one another. A control signal MODE from the mode register 130 may control the clock dividing circuit 122 to operate in different modes. For example, in some embodiments of the disclosure, the MODE signal may control the clock dividing circuit 122 to provide four multiphase clock signals in a first mode and provide two multiphase clock signals in a second mode.

The PCLK clock signals may have a lower clock frequency than the ICLK clock signal (and the CLKT and CLKB clock signals). For example, in some embodiments of the disclosure, the PCLK clock signals have half the clock frequency of the ICLK clock signal. The PCLK clock signals are provided by the clock dividing circuit 122 over clock signal lines to a clock generating circuit 124. Each of the PCLK clock signals are provided on a respective signal line. The signal lines are disposed between conductive lines on which respective voltages are provided. The respective voltages provided to the conductive lines may provide voltage conditions for the PCLK clock signals on the signal lines that are relatively the same for at least some of the clock edges of the clock signals.

The clock generating circuit 124 provides strobe clock signals DQS and DQSB based on the PCLK clock signals from the clock dividing circuit 122. The strobe clock signals DQS and DQSB have a clock frequency higher than the clock frequency of the PCLK clock signals from the clock dividing circuit 122. In some embodiments of the disclosure, the strobe clock signals DQS and DQSB have twice the clock frequency of the internal clock signals (and the same frequency as the ICLK clock signal and the CLKT and CLKB clock signals).

The clock generating circuit 124 is provided the MODE signal from the mode register 130 to control a mode of operation. For example, in some embodiments of the disclosure, in a first mode the clock generating circuit 124 may provide the strobe clock signals DQS and DQSB based on a first set of internal clock signals from the clock dividing circuit 122, and in a second mode the clock generating circuit 124 may provide the strobe clock signals DQS and DQSB based on a second set of internal clock signals from the clock dividing circuit 122. The clock generating circuit 124 may further provide multiphase clock signals to the input/output circuit 160 for controlling an output timing of read data.

An input buffer 162 receives strobe clock signals DQS and DQSB that are provided to the semiconductor device, for example, for a write operation. The input buffer 162 provides an internal strobe clock signal iDQS based on the received strobe clock signals to an input data clock path 164. The input data clock path 164 provides multiphase clock signals to the input/output circuit 160 for controlling an input timing of write data.

The power supply terminals are supplied with power supply potentials VDDQ and VSSQ. The power supply potentials VDDQ and VSSQ are supplied to the input/output circuit 160. The power supply potentials VDDQ and VSSQ are used for the input/output circuit 160 so that power supply noise generated by the input/output circuit 160 does not propagate to the other circuit blocks.

Figure 2:
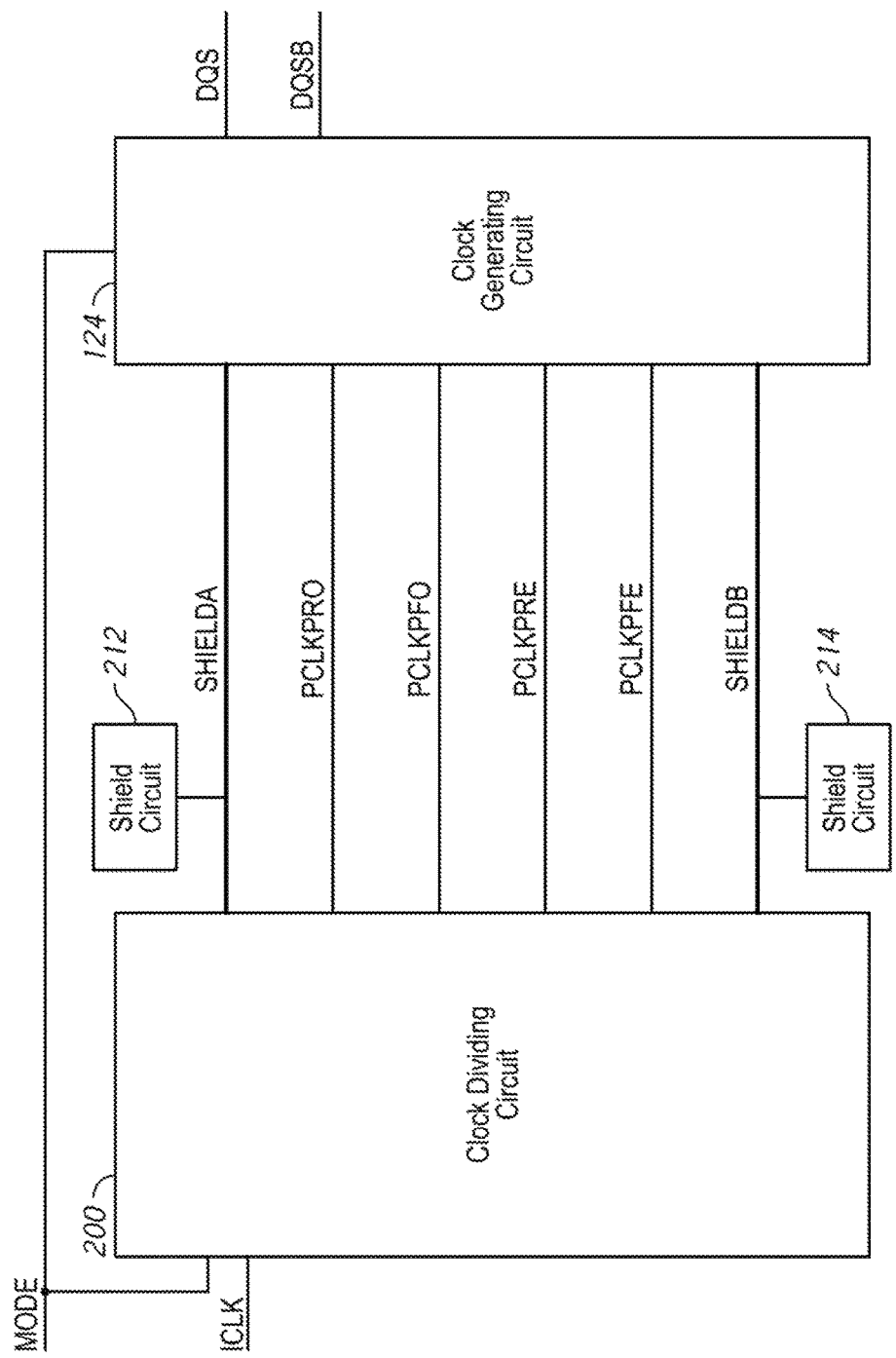
FIG. 2 is a block diagram of a clock dividing circuit according to an embodiment of the disclosure.

FIG. 2 is a block diagram of a clock dividing circuit 200 according to an embodiment of the disclosure. The clock dividing circuit 200 may be including in the clock dividing circuit 122 of the semiconductor 100 (FIG. 1) in some embodiments of the disclosure.

The clock dividing circuit 200 includes a divider circuit that receives an input clock signal ICLK and a control signal MODE. The divider circuit provides clock signals PCLKPRO, PCLKPFO, PCLKPRE, and PCLKPFE. The PCLKPRO, PCLKPFO, PCLKPRE, and PCLKPFE clock signals may be multiphase clock signals that have a common relative phase to one another. Each of the PCLKPRO, PCLKPFO, PCLKPRE, and PCLKPFE clock signals has a respective phase that is shifted relative to the other clock signals. In an embodiment of the disclosure, the PCLKPRO, PCLKPFO, PCLKPRE, and PCLKPFE clock signals have a relative phase of 90 degrees to one another. For example, the PCLKPFO clock signal is shifted by a phase of 90 degrees relative to the PCLKPRO clock signal, the PCLKPRE clock signal is shifted by a phase of 180 degrees relative to the PCLKPRO clock signal (and is shifted by a phase of 90 degrees relative to the PCLKPFO clock signal), and the PCLKPFE clock signal is shifted by a phase of 270 degrees relative to the PCLKPRO clock signal (and is shifted by a phase of 90 degrees relative to the PCLKPRE clock signal). In such a case, the multiphase clock signals PCLKPRO, PCLKPFO, PCLKPRE, and PCLKPFE clock signals may be referred to as "quadrature" phase clock signals.

The PCLKPRO, PCLKPFO, PCLKPRE, and PCLKPFE clock signals provided by the clock dividing circuit 200 have a lower clock frequency than the ICLK clock signal. For example, in some embodiments of the disclosure, the PCLKPRO, PCLKPFO, PCLKPRE, and PCLKPFE clock signals have one-half the clock frequency of the ICLK clock signal.

The clock dividing circuit 200 provides the PCLKPRO, PCLKPFO, PCLKPRE, and PCLKPFE clock signals on respective clock signal lines to the clock generating circuit 124. As previously described, the clock generating circuit 124 provides complementary strobe clock signals DQS and DQSB responsive to the clock signals from the clock dividing circuit 200. For example, in some embodiments of the disclosure the clock generating circuit 124 may provide the DQS and DQSB clock signals based on one of the rising (leading) and falling (trailing) clock edges of the PCLKPRO, PCLKPFO, PCLKPRE, and PCLKPFE clock signals when the MODE signal is a first logic level (e.g., first mode) or provide the DQS and DQSB clock signals based on both rising and falling clock edges of one or more of the PCLKPRO, PCLKPFO, PCLKPRE, and PCLKPFE clock signals (e.g., PCLKPRO and PCLKPFO clock signals) when the MODE signal is a second logic level (e.g., second mode).

In some embodiments of the disclosure, the strobe clock signals DQS and DQSB have twice the clock frequency of the PCLKPRO, PCLKPFO, PCLKPRE, and PCLKPFE clock signals (and have the same clock frequency as the ICLK clock signal). As a result, the ICLK clock signal and the DQS and DQSB clock signals are transferred at a first clock frequency and the PCLKPRO, PCLKPFO, PCLKPRE, and PCLKPFE clock signals are transferred in a second frequency that is one half of the first clock frequency.

Conductive lines SHIELDA and SHIELDB extend along the signal lines on which the clock signals are provided from the clock dividing circuit 200 to the clock generating circuit 124. Shield circuits 212 and 214 are coupled to the conductive lines SHIELDA and SHIELDB, respectively. The shield circuits 212 and 214 provide respective voltages to the conductive lines SHIELDA and SHIELDB. In embodiments of the disclosure where the clock dividing circuit 200 is included in the clock dividing circuit 122 of the semiconductor device 100, the signal lines shown in FIG. 2 may be used for providing the PCLK clock signals from the clock dividing circuit 122 to the clock generating circuit 124.

In some embodiments of the disclosure, the respective voltages provided by the shield circuits 212 and 214 may be the same or different from each other. In some embodiments of the disclosure, the respective voltages provided by the shield circuits 212 and 214 may be constant. In some embodiments of the disclosure, the respective voltages provided by the shield circuits 212 and 214 may change over time. For example, in some embodiments of the disclosure, the respective voltages provided by the shield circuits 212 and 214 may be based on a clock level and/or clock edge of one or more of the clock signals PCLKPRO, PCLKPFO, PCLKPRE, and PCLKPFE. Some embodiments of the disclosure include one or more of these variations for the respective voltages provided by the shield circuits 212 and 214.

In some embodiments of the disclosure, one or both of the conductive lines SHIELDA and SHIELDB extend an entire length of the signal lines for the clock signals between the clock dividing circuit 200 and the clock generating circuit 124. In some embodiments of the disclosure, one or both of the conductive lines SHIELDA and SHIELDB extend along at least a portion of the length of the signal lines between the clock dividing circuit 200 and the clock generating circuit 124.

The conductive lines SHIELDA and SHIELDB may be used to provide electrical shielding for the signal lines on which the clock signals PCLKPRO, PCLKPFO, PCLKPRE, and PCLKPFE are provided. The conductive lines may be used to mitigate impact of electrical noise that may affect the clock signals and/or electrical noise caused by the clock signals. As known, electrical noise may negatively affect voltage, timing, integrity, etc. of signals (e.g., including clock signals). Mitigating the negative effects of electrical noise may be desirable in some applications.

Although FIG. 2 shows the PCLKPRO, PCLKPFO, PCLKPRE, and PCLKPFE clock signals provided over the signal lines, in some embodiments of the disclosure, greater or fewer clock signals are provided over respective signal lines from the clock dividing circuit 200 to the clock generating circuit 124. For example, additional clock signals may be provided by the clock dividing circuit 200 on respective signal lines disposed between conductive lines SHIELDA and SHIELDB in some embodiments of the disclosure.

Figure 3:
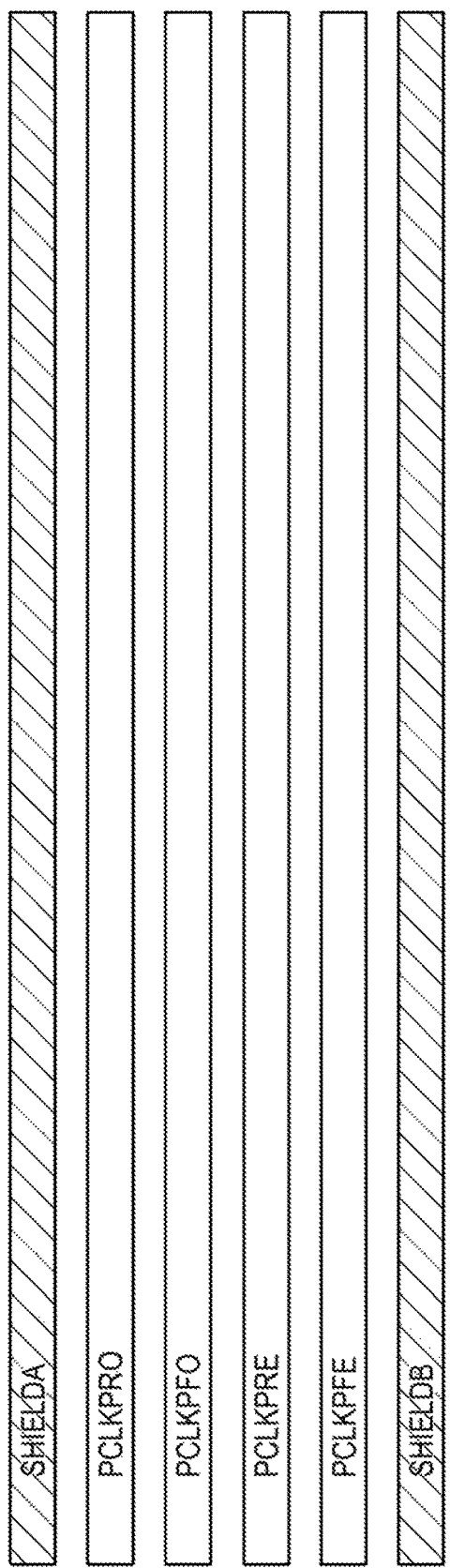
FIG. 3 is a diagram of signal lines for clock signals and conductive lines according to an embodiment of the disclosure.

FIG. 3 is a diagram of clock signal lines for the PCLKPRO, PCLKPFO, PCLKPRE, and PCLKPFE clock signals and conductive lines SHIELDA and SHIELDB according to an embodiment of the disclosure. The signal lines and conductive lines SHIELDA and SHIELDB of FIG. 3 may be used for the signal lines and conductive lines SHIELDA and SHIELDB of FIG. 2 in some embodiments of the disclosure.

The signal lines are disposed adjacent to one another and are parallel. The signal lines are disposed between the conductive lines SHIELDA and SHIELDB, with one of the signal lines directly next to the conductive line SHIELDA and another one of the signal lines directly next to the conductive line SHIELDB. The conductive lines SHIELDA and SHIELDB are disposed on opposite sides of the signal lines for the PCLKPRO, PCLKPFO, PCLKPRE, and PCLKPFE clock signals. The conductive lines SHIELDA and SHIELDB may be parallel to each other, and parallel to the signal lines.

In the example shown in FIG. 3, the signal line directly next to the conductive line SHIELDA provides the PCLKPRO clock signal and the signal line directly next to the conductive line SHIELDB provides the PCLKPFE clock signal. However, the particular clock signal provided by the signal lines directly next to the conductive lines SHIELDA and SHIELDB may be different than the specific example shown in FIG. 3. Additionally, while FIG. 3 shows four signal lines disposed between the conductive lines SHIELDA and SHIELDB, some embodiments of the disclosure have more signal lines disposed between the conductive lines SHIELDA and SHIELDB and some embodiments of the disclosure have fewer signal lines disposed between the conductive lines SHIELDA and SHIELDB. Thus, the scope of the disclosure is not limited to the specific example shown in FIG. 3.

The conductive lines SHIELDA and SHIELDB may be formed from a same conductive material as the signal lines for the PCLKPRO, PCLKPFO, PCLKPRE, and PCLKPFE clock signals. For example, in some embodiments of the disclosure, the conductive lines SHIELDA and SHIELDB may be formed from a same conductive layer as the signal lines.

Figure 4:
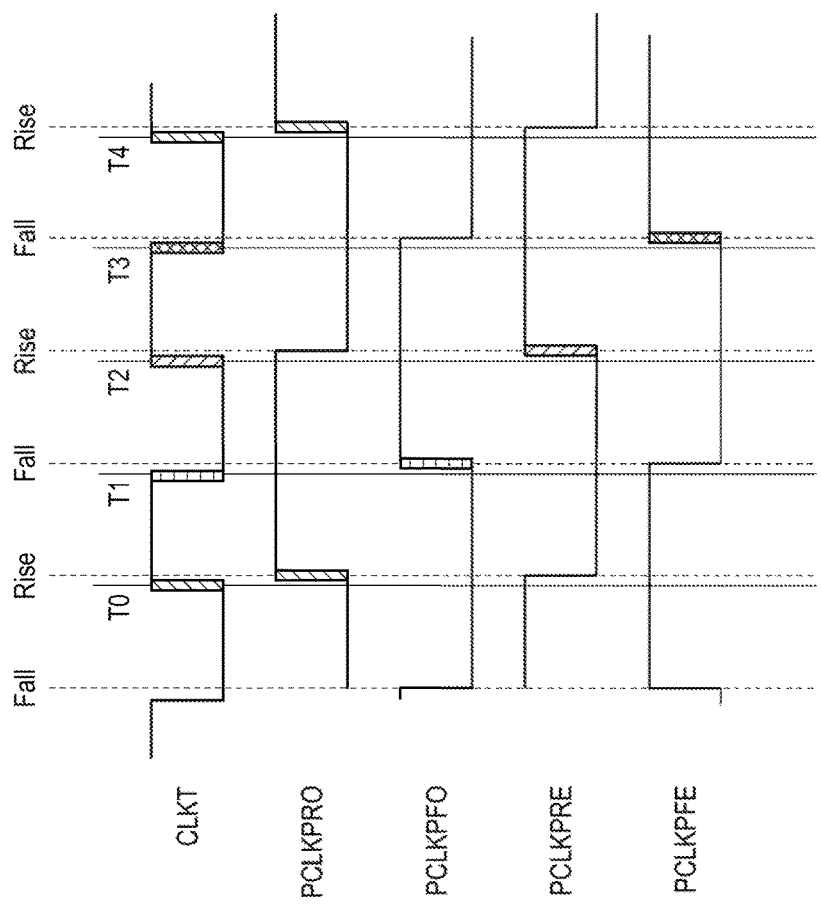
FIG. 4 is a timing diagram of clock signals provided by a clock dividing circuit according to an embodiment of the disclosure.

FIG. 4 is a timing diagram of clock signals PCLKPRO, PCLKPFO, PCLKPRE, and PCLKPFE provided by a clock dividing circuit according to an embodiment of the disclosure. In some embodiments of the disclosure, the clock dividing circuit is the clock dividing circuit 200 of FIG. 2.

An external clock signal CLKT is shown having rising clock edges at times T0, T2, and T4, and having falling (trailing) clock edges at times T1 and T3. In embodiments of the disclosure where the clock dividing circuit is the clock dividing circuit 200 of FIG. 2, the CLKT clock signal may be the ICLK clock signal provided by the input buffer 120. The PCLKPRO, PCLKPFO, PCLKPRE, and PCLKPFE clock signals provided by the clock dividing circuit are shown in FIG. 4 as having one-half the clock frequency of the CLKT clock signal, and having a 90 degree phase relationship with one another.

The clock dividing circuit provides PCLKPRO, PCLKPFO, PCLKPRE, and PCLKPFE clock signals having rising clock edges that correspond to a rising or falling clock edge of the CLKT clock signal. For example, a rising clock edge of the PCLKPRO clock signal corresponds to the rising clock edge of the CLKT clock signal at time T0; a rising clock edge of the PCLKPFO clock signal corresponds to the falling clock edge of the CLKT clock signal at time T1; a rising clock edge of the PCLKPRE clock signal corresponds to the rising clock edge of the CLKT clock signal at time T2; and a rising clock edge of the PCLKPFE clock signal corresponds to the falling clock edge of the CLKT clock signal at time T3. The sequence of rising clock edges for the PCLKPRO, PCLKPFO, PCLKPRE, and PCLKPFE clock signals repeats again with a second rising clock edge of the PCLK_RO clock signal that corresponds to the rising clock edge of the CLKT clock signal at time T4.

FIG. 5 is a diagram of clock signals PCLKPRO, PCLKPFO, PCLKPRE, and PCLKPFE provided to respective signal lines and voltages of conductive lines SHIELDA and SHIELDB, between which signal lines are disposed, according to an embodiment of the disclosure. In various embodiments of the disclosure, the timing of the clock signals and the voltages of the conductive lines shown in FIG. 5 may be used in one or more of the examples of FIGS. 1-4.

The conductive lines SHIELDA and SHIELDB may be driven to the respective voltages by respective shield circuits, for example, shield circuits 212 and 214 in some embodiments of the disclosure. The clock signals PCLKPRO, PCLKPFO, PCLKPRE, and PCLKPFE may be provided by a clock dividing circuit, for example, clock dividing circuit 200 of FIG. 2 or the clock dividing circuit 122 of FIG. 1 in some embodiments of the disclosure.

As shown in FIG. 5, conductive line SHIELDA has a first constant voltage and conductive line SHIELDB has a second constant voltage. The conductive line SHIELDA is directly adjacent the signal line for the PCLKPRO clock signal and the conductive line SHIELDB is directly adjacent the signal line for the PCKPFE clock signal. The first constant voltage may be greater than the second constant voltage. For example, the first voltage may be a first power supply voltage VDD2, and the second voltage may be a second power supply voltage VSS, for example, ground. The conductive line SHIELDA and the conductive line SHIELDB have voltages that are constant while the PCLKPRO, PCLKPFO, PCLKPRE, and PCLKPFE clock signals are active, clocking between a high clock level and a low clock level. For example, the first conductive line remains at the first voltage while the PCLKPRO clock signal changes to a high clock level at time T0 and changes to a low clock level at time T2. Likewise, the second conductive line remains at the second voltage while the PCLKPFE clock signal changes to a low lock level at time T1 and changes to a high clock level at time T3. A voltage corresponding to a high clock level may be equal to the voltage of the conductive line SHIELDA (e.g., VDD2) and a voltage corresponding to a low clock level may be equal to the voltage of the conductive line SHIELDB (e.g., VSS).

FIG. 6 is a schematic diagram of clock drivers 610, and shield circuits 620 and 630 according to an embodiment of the disclosure. In various embodiments of the disclosure, the clock drivers 610, and shield circuits 620 and 630 may be used in one or more of the examples of FIGS. 1-5. For example, in some embodiments of the disclosure, the clock drivers 610 may be used to provide the clock signals PCLKPRO, PCLKPFO, PCLKPRE, and PCLKPFE on respective signal lines 612(RO), 612(FO), 612(RE), and 612(FE), and the shield circuits 620 and 630 may be used to provide the voltages for the conductive lines SHIELDA and SHIELDB as described with reference to the example of FIG. 5. In some embodiments of the disclosure, the clock drivers 610 are included in the clock dividing circuit 200 and the shield circuits 620 and 630 are included in shield circuits 212 and 214, respectively, as described with reference to FIG. 2.

Each of the clock drivers 610 provides a respective one of the clock signals PCLKPRO, PCLKPFO, PCLKPRE, and PCLKPFE on a respective signal line 612(RO), 612(FO), 612(RE), and 612(FE). The clock drivers 610 are shown in FIG. 6 as inverters. In the example of the clock drivers 610 as inverters, each clock driver receives the complement of the clock signal it provides to the respective signal line. In other embodiments of the disclosure, the clock drivers 610 may be implemented as another circuit, for example, a non-inverting buffer circuit. The shield circuit 620 is coupled to a first power supply that provides a first power supply voltage (e.g., VDD2) and a conductive line SHIELDA. When activated by activation signal ACTP (e.g., an active low logic level), the shield circuit 620 provides the first power supply voltage to the conductive line SHIELDA. The shield circuit 630 is coupled to a second power supply that provides a second power supply voltage (e.g., VSS) and a conductive line SHIELDB. When activated by activation signal ACTN (e.g., an active high logic level), the shield circuit 630 provides the second power supply voltage to the conductive line SHIELDB. The ACTP and ACTN signals may be provided by a control circuit that may be included in, for example, a command decoder of a semiconductor device. The shield circuit 620 is shown in FIG. 6 as a p-type transistor and the shield circuit 630 is shown as an n-type transistor. The drive strength of the p-type transistor may be the same as the drive strength of a p-type transistor included in the clock driver 910 (FIG. 9), and the drive strength of the n-type transistor may be the same as the drive strength of the n-type transistor included in the clock driver. However, in other embodiments of the disclosure, the shield circuits 620 and 630 may be implemented by other circuits.

The conductive lines SHIELDA and SHIELDB may be used to provide electrical shielding for the signal lines on which the clock signals PCLKPRO, PCLKPFO, PCLKPRE, and PCLKPFE are provided. By shielding the signal lines, and setting voltage of the conductive line while the clock signals are active, the negative effect of electrical noise may be mitigated, and improve signal integrity of the clock signals compared to unshielded signal lines.

The constant voltage of the conductive lines SHIELDA and SHIELDB provide surrounding voltage conditions for each of the respective signal lines that are the same for rising clock edges of the respective clock signals. The surrounding voltage conditions for each of the respective signal lines for falling clock edges of the respective clock signals, however, may be different. In some embodiments of the disclosure, a shield circuits providing the constant voltages of VDD2 and VSS to the conductive lines SHIELDA and SHIELDB have equal driver strength to a clock driver strength for each of the clock signals PCLKPRO, PCLKPFO, PCLKPRE, and PCLKPFE. Coupling noise applied on the conductive lines SHIELDA and SHIELDB is further reflected on the clock signals PCLKPRO, PCLKPFO, PCLKPRE, and PCLKPFE. As a result, where the clock driver strengths for the constant voltages VDD2 and VSS and for the clock signals PCLKPRO, PCLKPFO, PCLKPRE, and PCLKPFE are equal, the effect of the noise will be equal for the clock signals PCLKPRO, PCLKPFO, PCLKPRE, and PCLKPFE.

FIG. 7 is a diagram of a table that shows surrounding voltage conditions for each of the signal lines and the respective clock signals PCLKPRO, PCLKPFO, PCLKPRE, and PCLKPFE according to an embodiment of the disclosure. The voltage conditions shown in FIG. 7 may be provided by the clock drivers 610 for the clock signals PCLKPRO, PCLKPFO, PCLKPRE, and PCLKPFE on respective signal lines, and by the shield circuits 620 and 630 for the conductive lines SHIELDA and SHIELDB described with reference to FIG. 6 in some embodiments of the disclosure.

As shown in FIG. 7, at a time of a rising clock edge for the clock signals PCLKPRO, PCLKPFO, PCLKPRE, and PCLKPFE, the voltage at an upper position relative to the respective clock signal and the voltage at a lower position relative to the respective clock signal is the same for each of the respective clock signals. For example, with reference to FIGS. 5 and 6, and assuming an embodiment of the disclosure where the surrounding voltage conditions are provided by the clock drivers 610 and shield circuits 620 and 630, at a time of a rising clock edge of the clock signal PCLKPRO (e.g., at time T0) on the respective signal line 612(RO) a VDD2 voltage is provided at an upper position by the conductive line SHIELDA and a VSS voltage is provided at a lower position by the PCLKPFO clock signal on the respective signal line 612(FO). At a time of a rising clock edge of the clock signal PCLKPFO (e.g., at time T1) on the respective signal line 612(FO) a VDD2 voltage is provided at an upper position by the PCLKPRO clock signal on the respective signal line 612(RO) and a VSS voltage is provided at a lower position by the PCLKPRE clock signal on the respective signal line 612(RE). At a time of a rising clock edge of the clock signal PCLKPRE (e.g., at time T2) on the respective signal line 612(RE) a VDD2 voltage is provided at an upper position by the PCLKPFO clock signal on the respective signal line 612(FO) and a VSS voltage is provided at a lower position by the PCLKPFE clock signal on the respective signal line 612(FE). At a time of a rising clock edge of the clock signal PCLKPFE (e.g., at time T3) on the respective signal line 612(FE) a VDD2 voltage is provided at an upper position by the PCLKPRE clock signal on the respective signal line 612(RE) and a VSS voltage is provided at a lower position by the conductive line SHIELDB.

As described with reference to FIG. 7, voltage conditions on first and second signal lines (or a signal line and a conductive line) for rising clock edges of a clock signal provided on a respective signal line disposed between the first and second signal lines (or signal line and conductive line) is the same for rising clock edges of the clock signals PCLKPRO, PCLKPFO, PCLKPRE, and PCLKPFE. Having the same voltage conditions may mitigate variations in timing/phase between the clock signals due to different voltage influences, such as when a clock signal transitions from a low clock level to a high clock level. Thus, embodiments of the disclosure such as that described with reference to FIG. 7 may be advantageous where the timing of rising clock edges are critical.

FIG. 8 is a diagram of clock signals PCLKPRO, PCLKPFO, PCLKPRE, and PCLKPFE provided to respective signal lines and voltages of conductive lines SHIELDA and SHIELDB, between which signal lines are disposed, according to an embodiment of the disclosure. In various embodiments of the disclosure, the timing of the clock signals and the voltages of the conductive lines shown in FIG. 8 may be used in one or more of the examples of FIGS. 1-4.

The conductive lines SHIELDA and SHIELDB may be driven to the respective voltages by respective shield circuits, for example, shield circuits 212 and 214 in some embodiments of the disclosure. The clock signals PCLKPRO, PCLKPFO, PCLKPRE, and PCLKPFE may be provided by a clock dividing circuit, for example, clock dividing circuit 200 of FIG. 2 or the clock dividing circuit 122 of FIG. 1 in some embodiments of the disclosure. The conductive line SHIELDA is directly adjacent the signal line for the PCLKPRO clock signal and the conductive line SHIELDB is directly adjacent the signal line for the PCKPFE clock signal.

As shown in FIG. 8, the PCLKPRO, PCLKPFO, PCLKPRE, and PCLKPFE clock signals are active, clocking between a high clock level and a low clock level. The conductive line SHIELDA has a first voltage and conductive line SHIELDB has a second voltage. In contrast to FIG. 5, the first voltage and second voltage change over time, changing from a high voltage level and a low voltage level. As will be described in more detail below, the first and second voltages change voltage to provide a same surrounding voltage condition for rising clock edges and falling clock edges for each of the respective signal lines of the respective clock signals.

In the example of FIG. 8, a rising edge of the first voltage of the conductive line SHIELDA corresponds to a falling clock edge of the PCLKPFO clock signals and a rising clock edge of the PCLKPFE clock signal, and a falling edge of the first voltage corresponds to a rising clock edge of the PCLKFO clock signal and a falling clock edge of the PCLKPFE clock signal. A rising edge of the second voltage of the conductive line SHIELDB corresponds to a rising clock edge of the PCLKPRO clock signal and a falling clock edge of the PCLKPRE clock signal, and a falling edge of the second voltage corresponds to a falling edge of the PCLKPRO clock signal and a rising edge of the PCLKPRE clock signal. The first and second voltages may change in some embodiments of the disclosure at a same frequency as a clock frequency of active PCLKPRO, PCLKPFO, PCLKPRE, and PCLKPFE clock signal. A phase of the second voltage may be shifted by 90 degrees relative to the first voltage.

A voltage corresponding to a high clock level may be equal to the high voltage level of the conductive lines SHIELDA and SHIELDB (e.g., VDD2) and a voltage corresponding to a low clock level may be equal to the low voltage level of the conductive lines SHIELDA and SHIELDB (e.g., VSS).

FIG. 9 is a schematic diagram of clock drivers 910, and shield circuits 920 and 930 according to an embodiment of the disclosure. In various embodiments of the disclosure, the clock drivers 910, and shield circuits 920 and 930 may be used in one or more of the examples of FIGS. 1-5. For example, in some embodiments of the disclosure, the clock drivers 910 may be used to provide the clock signals PCLKPRO, PCLKPFO, PCLKPRE, and PCLKPFE on respective signal lines 912(RO), 912(FO), 912(RE), and 912(FE), and the shield circuits 920 and 930 may be used to provide the voltages for the conductive lines SHIELDA and SHIELDB as described with reference to the example of FIG. 8. In some embodiments of the disclosure, the clock drivers 910 are included in the clock dividing circuit 200 and the shield circuits 920 and 930 are included in shield circuits 212 and 214, respectively, as described with reference to FIG. 2.

Each of the clock drivers 910 provides a respective one of the clock signals PCLKPRO, PCLKPFO, PCLKPRE, and PCLKPFE on a respective signal line 912(RO), 912(FO), 912(RE), and 912(FE). The clock drivers 910 are shown in FIG. 9 as inverters. In the example of the clock drivers 910 as inverters, each clock driver receives the complement of the clock signal it provides to the respective signal line. In other embodiments of the disclosure, the clock drivers 910 may be implemented as another circuit, for example, a non-inverting buffer circuit. The shield circuit 920 includes a signal driver circuit that receives an input signal INA and provides a first voltage to a conductive line SHIELDA. The shield circuit 930 includes a signal driver circuit that receives an input signal INB and provides a second voltage to a conductive line SHIELDB. The shield circuits 920 and 930 are shown in FIG. 9 as inverters. In the example of the shield circuits 920 and 930 as inverters, each shield circuit receives the complement of the voltage it provides to the respective conductive line. As an example, where the shield circuits 920 and 930 provide the first and second voltages to the conductive lines SHIELDA and SHIELDB as shown in the example of FIG. 8, the shield circuit 920 may receive the PCLKPFO clock signal, or a signal having the same phase as the PCLKPFO clock signal, to provide the first voltage to the conductive line SHIELDA, and the shield circuit 930 may receive the PCLKPRE clock signal, or a signal having the same phase as the PCLKPRE clock signal, to provide the first voltage to the conductive line SHIELDB. In other embodiments of the disclosure, the shield circuits 920 and 930 may be implemented by circuits other than inverters.

The conductive lines SHIELDA and SHIELDB may be used to provide electrical shielding for the signal lines on which the clock signals PCLKPRO, PCLKPFO, PCLKPRE, and PCLKPFE are provided. By shielding the signal lines, and setting voltage of the conductive line while the clock signals are active, the negative effect of electrical noise may be mitigated, and improve signal integrity of the clock signals compared to unshielded signal lines.

The changing voltages of the conductive lines SHIELDA and SHIELDB provide surrounding voltage conditions for each of the respective signal lines that are the same for rising and falling clock edges of the respective clock signals. In some embodiments of the disclosure, the shield circuits providing the first and second voltages to the SHIELDA and SHIELDB conductive lines have equal drive strength to a clock driver strength for each of the clock signals PCLKPRO, PCLKPFO, PCLKPRE, and PCLKPFE.

FIG. 10 is a diagram of a table that shows surrounding voltage conditions for each of the signal lines and the respective clock signals PCLKPRO, PCLKPFO, PCLKPRE, and PCLKPFE according to an embodiment of the disclosure. The voltage conditions shown in FIG. 10 may be provided by the clock drivers 910 for the clock signals PCLKPRO, PCLKPFO, PCLKPRE, and PCLKPFE on respective signal lines, and by the shield circuits 920 and 930 for the conductive lines SHIELDA and SHIELDB described with reference to FIG. 9 in some embodiments of the disclosure.

As shown in FIG. 10, at a time of a rising clock edge for the clock signals PCLKPRO, PCLKPFO, PCLKPRE, and PCLKPFE, the voltage at an upper position relative to the respective clock signal and the voltage at a lower position relative to the respective clock signal is the same for each of the respective clock signals. For example, with reference to FIGS. 8 and 9, and assuming an embodiment of the disclosure where the surrounding voltage conditions are provided by the clock drivers 910 and shield circuits 920 and 930 with a high clock level and high voltage level of VDDs and a low clock level and low voltage level of VSS, at a time of a rising clock edge of the clock signal PCLKPRO (e.g., at time T0) on the respective signal line 912(RO) a VDD2 voltage is provided at an upper position by the conductive line SHIELDA and a VSS voltage is provided at a lower position by the PCLKPFO clock signal on the respective signal line 912(FO). At a time of a rising clock edge of the clock signal PCLKPFO (e.g., at time T1) on the respective signal line 912(FO) a VDD2 voltage is provided at an upper position by the PCLKPRO clock signal on the respective signal line 912(RO) and a VSS voltage is provided at a lower position by the PCLKPRE clock signal on the respective signal line 912(RE). At a time of a rising clock edge of the clock signal PCLKPRE (e.g., at time T2) on the respective signal line 912(RE) a VDD2 voltage is provided at an upper position by the PCLKPFO clock signal on the respective signal line 912(FO) and a VSS voltage is provided at a lower position by the PCLKPFE clock signal on the respective signal line 912(FE). At a time of a rising clock edge of the clock signal PCLKPFE (e.g., at time T3) on the respective signal line 912(FE) a VDD2 voltage is provided at an upper position by the PCLKPRE clock signal on the respective signal line 912(RE) and a VSS voltage is provided at a lower position by the conductive line SHIELDB.

At a time of a falling clock edge for the clock signals PCLKPRO, PCLKPFO, PCLKPRE, and PCLKPFE, the voltage at an upper position relative to the respective clock signal and the voltage at a lower position relative to the respective clock signal is also the same for each of the respective clock signals. For example, in particular, with reference to FIGS. 8-10, at a time of a falling clock edge of the clock signal PCLKPRO (e.g., at time T2) on the respective signal line 912(RO) a VSS voltage is provided at an upper position by the conductive line SHIELDA and a VDD2 voltage is provided at a lower position by the PCLKPFO clock signal on the respective signal line 912 (FO). At a time of a falling clock edge of the clock signal PCLKPFO (e.g., at time T3) on the respective signal line 912(RO) a VSS voltage is provided at an upper position by the PCLKOPRO clock signal on the respective signal line 912(RO) and a VDD2 voltage is provided at a lower position by the PCLKPRE clock signal on the respective signal line 912(RE). At a time of a falling clock edge of the clock signal PCLKPRE (e.g., at time T0) on the respective signal line 912(RE) a VSS voltage is provided at an upper position by the PCLKOPFO clock signal on the respective signal line 912(FO) and a VDD2 voltage is provided at a lower position by the PCLKPFE clock signal on the respective signal line 912(FE). At a time of a falling clock edge of the clock signal PCLKPFE (e.g., at time T1) on the respective signal line 912(FE) a VSS voltage is provided at an upper position by the PCLKPRE clock signal on the respective signal line 912(RE) and a VDD2 voltage is provided at a lower position by the conductive line SHIELDB.

As described with reference to FIG. 10, voltage conditions on first and second signal lines (or a signal line and a conductive line) for rising and falling clock edges of a clock signal provided on a respective signal line disposed between the first and second signal lines (or signal line and conductive line) is the same for rising and falling clock edges of the clock signals PCLKPRO, PCLKPFO, PCLKPRE, and PCLKPFE. Having the same voltage conditions may mitigate variations in timing/phase between the clock signals due to different voltage influences, such as when a clock signal transitions from a low clock level to a high clock level or from a high clock level to a low clock level. Thus, embodiments of the disclosure such as that described with reference to FIG. 10 may be advantageous where the timing of rising and falling clock edges are critical.

The previously described examples include four clock signals on four signal lines disposed between two conductive lines SHIELDA and SHIELDB. A total of six lines are used to provide the four clock signals and provide shielding. Thus, 50% of the total lines are for shielding. Some embodiments of the disclosure include more clock signals on signal lines than the four described.

FIG. 11 is a diagram of a table that shows a relative relationship between a number of clock signals and respective signal lines and conductive lines that may be used for shielding the clock signals according to an embodiment of the disclosure.

In embodiments of the disclosure including eight clock signals on eight signal lines disposed between two conductive lines SHIELDA and SHIELDB, a total of 10 lines are used. The eight clock signals may have a phase relationship of 45 degrees relative to one another. As a result, 25% of the total lines are for shielding. FIG. 11 shows other examples as well, such as 16 clock signals (e.g. 22.5 degrees phase relationship) on 16 signal lines and two conductive lines for shielding, and 32 clock signals (e.g., 12.25 degrees phase relationship) on 32 signal lines and two conductive lines for shielding.

As shown by the examples of FIG. 11, as the number of clock signals and corresponding signal lines are increased between two conductive lines for shielding, the percentage of the conductive lines relative to the signal lines decreases, which may be desirable in some designs.

From the foregoing it will be appreciated that, although specific embodiments of the disclosure have been described herein for purposes of illustration, various modifications may be made without deviating from the spirit and scope of the disclosure. Accordingly, the scope of the disclosure should not be limited any of the specific embodiments described herein.

What is claimed is:

1. An apparatus, comprising:
a plurality of signal lines on which clock signals are provided;
a plurality of conductive lines between which the plurality of signal lines are disposed, wherein a number of the plurality of conductive lines is less than or equal to one-half of a number of the plurality of signal lines;
a first shield circuit coupled to a first conductive line of the plurality of conductive lines; and
a second shield circuit coupled to a second conductive line of the plurality of conductive lines,
wherein the first shield circuit is configured to provide a first voltage to the first conductive line of the plurality of conductive lines and the second shield circuit is configured to provide a second voltage to the second conductive line of the plurality of conductive lines to provide a same surrounding voltage condition for a rising edge of a first clock signal provided on a first signal line of the plurality of signal lines and for a rising edge of a second clock signal provided on a second signal line of the plurality of the signal lines while clock signals are provided on the plurality of signal lines, wherein a phase of the second clock signal is shifted relative to the first clock signal and a phase of the second voltage is shifted 90 degrees relative to the first voltage,
wherein the first shield circuit is configured to provide the first voltage and the second shield circuit is configured to provide the second voltage to also provide a same surrounding voltage condition for a falling edge of a first clock signal and for a falling edge of a second clock signal, and
wherein the first voltage provided by the first shield circuit and the second voltage provided by the second shield circuit change voltages over time.

2. The apparatus of claim 1 wherein the first voltage provided by the first shield circuit and the second voltage provided by the second shield circuit are different.

3. The apparatus of claim 1 wherein the first voltage provided by the first shield circuit and the second voltage provided by the second shield circuit are constant voltages.

4. The apparatus of claim 1 wherein one of the first and second voltages is a first power supply voltage and the other of the first and second voltages is a second power supply voltage that is different than the first power supply voltage.

5. The apparatus of claim 1 wherein the plurality of signal lines includes four signal lines and the clock signals comprise quadrature clock signals, each provided on a respective one of the four signal lines.

6. The apparatus of claim 1 wherein the same surrounding voltage condition comprises a first voltage level at an upper position relative to a respective one of the clock signals and a second voltage level at a lower position relative to the respective one of the clock signals, wherein the second voltage level is different from the first voltage level.

7. An apparatus, comprising:
a clock dividing circuit configured to provide a plurality of phase related clock signals, wherein the plurality of phase related clock signals includes first, second, third, and fourth clock signals;
a plurality of signal lines coupled to the clock dividing circuit to receive the plurality of phase related clock signals, wherein the plurality of signal lines includes first, second, third, and fourth signal lines, and the first clock signal is provided on the first signal line, the second clock signal is provided on the second signal line, the third clock signal is provided on the third signal line, and the fourth clock signal is provided on the fourth signal line;
a clock generating circuit coupled to the plurality of signal lines and configured to receive the plurality of phase related clock signals from the clock dividing circuit and provide data strobe signals;
first and second conductive lines between which the plurality of signal lines are disposed, wherein the first conductive line is disposed adjacent the first signal line and the first signal line is disposed between the second signal line and the first conductive line, and wherein the second conductive line is disposed adjacent to the third signal line and the third signal line is disposed between the fourth signal line and the second conductive line;
a first shield circuit coupled to the first conductive line and configured to provide a first voltage to the first conductive line; and
a second shield circuit coupled to the second conductive line and configured to provide a second voltage to the second conductive line, wherein the first and second shield circuits provide the first and second voltages to provide a same surrounding voltage condition for a transition of a first clock signal of the plurality of clock signals and for a transition of a second clock signal of the plurality of clock signals,
wherein the first voltage and the second voltage provide a same surrounding voltage condition for a rising clock edge and a falling clock edge of the first clock signal on the first signal line and a rising clock edge and a falling clock edge of the third clock signal on the third signal line when the first, second, third, and fourth clock signals are provided on the first, second, third, and fourth signal lines, and
wherein the first voltage changes and the second voltage changes when the plurality of phase related clock signals are active, and the first and second voltages change at a same frequency as a clock frequency of the plurality of phase related clock signals.

8. An apparatus, comprising:
a clock dividing circuit configured to provide a plurality of phase related clock signals;
a plurality of signal lines coupled to the clock dividing circuit to receive the plurality of phase related clock signals;
a clock generating circuit coupled to the plurality of signal lines and configured to receive the plurality of phase related clock signals from the clock dividing circuit and provide data strobe signals;
first and second conductive lines between which the plurality of signal lines are disposed;
a first shield circuit coupled to the first conductive line and configured to provide a first voltage to the first conductive line; and
a second shield circuit coupled to the second conductive line and configured to provide a second voltage to the first conductive line, wherein the first and second shield circuits provide the first and second voltages to provide a same surrounding voltage condition for a transition of a first clock signal of the plurality of clock signals and for a transition of a second clock signal of the plurality of clock signals,
wherein the first and second shield circuits comprise inverters and the first shield circuit provides the complement of the second clock signal as the first voltage and the second shield circuit provides the complement of the fourth clock signal as the second voltage.

* * * * *